(12) United States Patent
Itatani et al.

(10) Patent No.: US 7,709,276 B2
(45) Date of Patent: May 4, 2010

(54) MANUFACTURING METHOD OF A SEMICONDUCTOR DEVICE AND SUBSTRATE PROCESSING APPARATUS

(75) Inventors: Hideharu Itatani, Nanto (JP); Kazuhiro Harada, Tsukaba (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/155,221

(22) Filed: May 30, 2008

(65) Prior Publication Data

US 2008/0305633 A1 Dec. 11, 2008

(30) Foreign Application Priority Data

May 31, 2007 (JP) ............... 2007-145870

(51) Int. Cl.
*H01L 21/00* (2006.01)
(52) U.S. Cl. ............... 438/3; 438/785; 134/1.1; 134/22.1
(58) Field of Classification Search ............ 134/1.1; 118/715; 156/345.33
See application file for complete search history.

(56) References Cited

U.S. PATENT DOCUMENTS

| 6,576,481 B2* | 6/2003 | Itatani et al. ............ 438/3 |
| 2002/0072211 A1* | 6/2002 | Itatani et al. ............ 438/608 |
| 2003/0037802 A1* | 2/2003 | Nakahara et al. ......... 134/1.1 |

FOREIGN PATENT DOCUMENTS

JP    A-2002-180250    6/2002

\* cited by examiner

*Primary Examiner*—Charles D Garber
*Assistant Examiner*—Yasser A Abdelaziez
(74) *Attorney, Agent, or Firm*—Oliff & Berridge, PLC

(57) ABSTRACT

A by-product (e.g., $RuF_5$) that is produced in the process of cleaning may cover a cleaning subject film and may obstruct the progress of the cleaning. To suppress an accumulation of the by-product, a cleaning operation is divided into plural operations, performing vacuum evacuation between the divided operations to evaporate the by-product and expose a new surface of the cleaning subject film between each supply of cleaning gas.

8 Claims, 4 Drawing Sheets

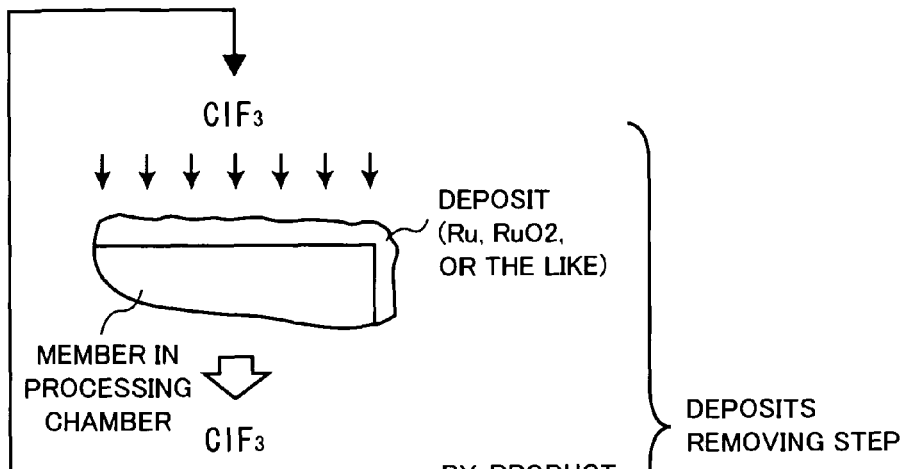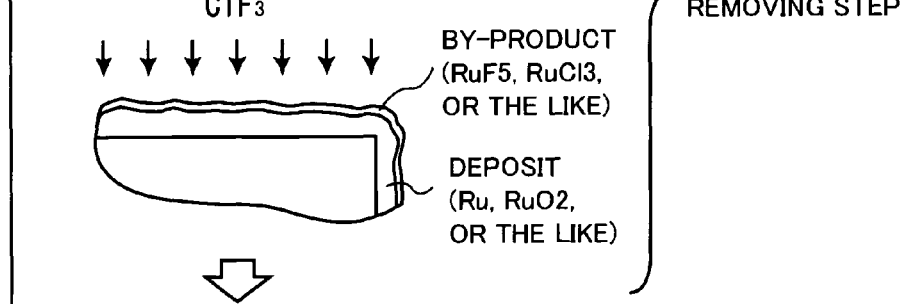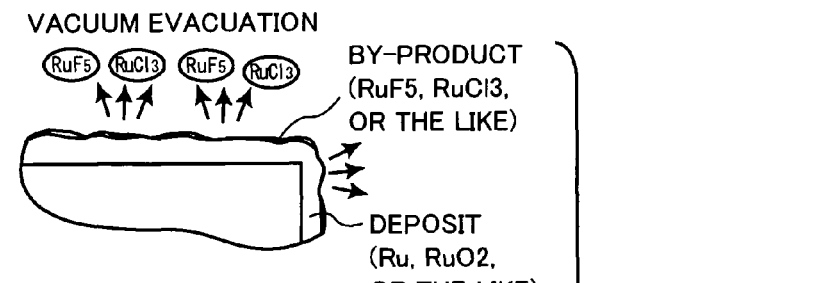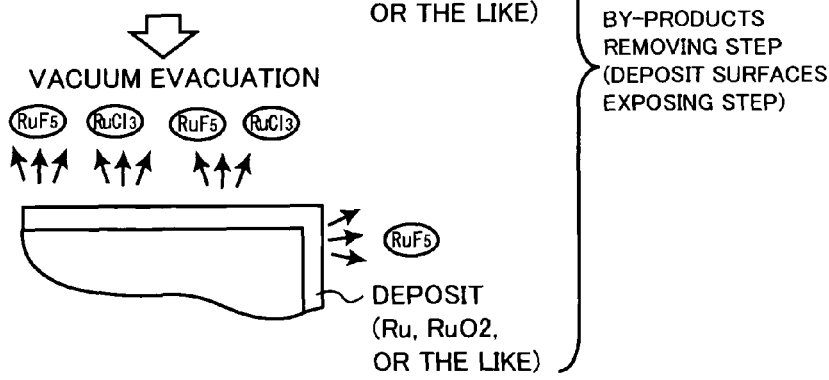

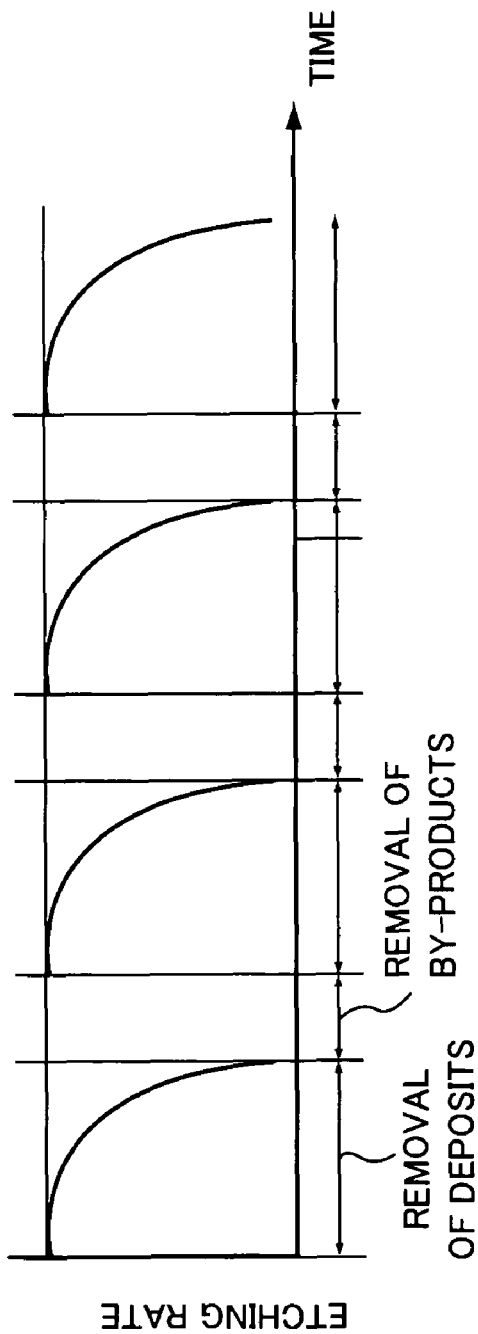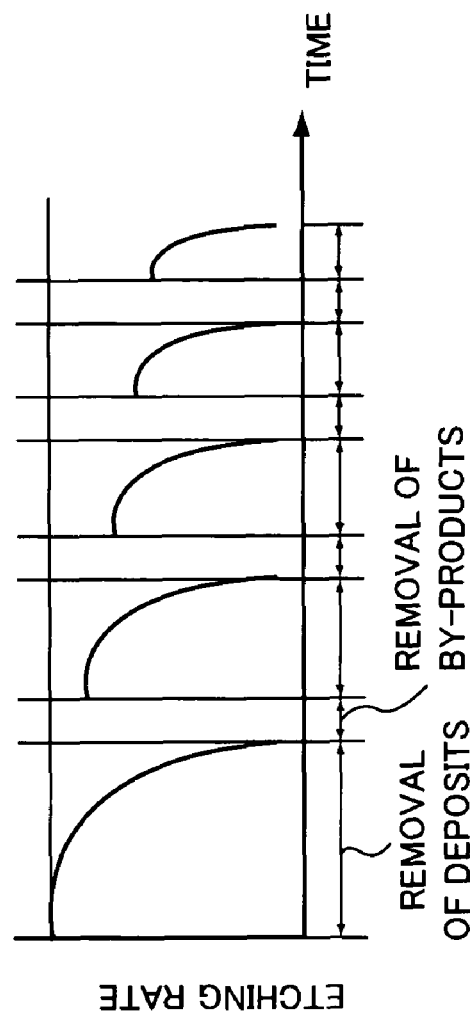
FIG.3A
FIG.3B

MANUFACTURING METHOD OF A SEMICONDUCTOR DEVICE AND SUBSTRATE PROCESSING APPARATUS

BACKGROUND OF THE INVENTION

1. Field of the Invention

The present invention relates to a semiconductor device manufacturing method and a substrate processing apparatus for a semiconductor manufacturing process in which a ruthenium (Ru) film, a ruthenium oxide ($RuO_2$) film, or a lamination film thereof is formed on the surface of a wafer.

2. Description of the Related Art

As for the formation of an Ru film and an $RuO_2$ film which are candidates for capacitor electrodes of next-generation DRAMs, a film formation technique using sputtering has been established and is used widely on a research level. However, since this method is low in step coverage, a thermal CVD method is desired to be used for mass production because of its superior step coverage and research and development for that purpose are now being made enthusiastically. In the thermal CVD method, in general, the film forming material is in the form of a solution obtained by dissolving a liquid or a powder of an organic metal in a solvent; it is vaporized with a vaporizer or by bubbling and supplied onto a substrate. When an Ru film or an $RuO_2$ film is formed on a substrate by a thermal CVD method, Ru films or $RuO_2$ films are also deposited on members such as a substrate holder around the substrate in the processing chamber. As the film formation is performed repeatedly, Ru films or $RuO_2$ films deposited on such members maypeel off to cause particles on a substrate, which is a factor in lowering the yield of device manufacture. Furthermore, if particles occur, it is necessary to stop operation of a manufacturing apparatus and to replace film-deposited members with new ones or perform wet cleaning. This lowers the working rate of the apparatus, that is, the mass-productivity.

One countermeasure against the above problem is to remove deposited films by cleaning the inside of the processing chamber. Example methods for cleaning Ru films or $RuO_2$ films deposited in a processing chamber are a dry cleaning method and a wet cleaning method. One known dry cleaning method is a method using a $ClF_3$ gas (refer to JP-A-2002-180250, for example).

However, conventional methods have a problem that the apparatus downtime due to cleaning is long and hence the productivity is low. Factors in causing a long downtime are a long cleaning time and generation of particles after cleaning.

SUMMARY OF THE INVENTION

An object of the present invention is to solve the above problems and to provide a semiconductor manufacturing method and a substrate processing apparatus capable of increasing the productivity by shortening the apparatus downtime due to cleaning.

One aspect of the invention provides a method of manufacturing a semiconductor device comprises carrying a substrate into a processing chamber, forming a film containing ruthenium on the substrate by supplying a material gas into the processing chamber, carrying the film-formed substrate out of the processing chamber; and cleaning an inside of the processing chamber by executing, alternately plural times, removing deposits containing ruthenium deposited in the processing chamber by supplying a cleaning gas whose molecule has a fluorine atom or a chlorine atom into the processing chamber and exposing surfaces of the deposits by removing a by-product generated so as to cover the surfaces of the deposits in removing the deposits.

Another aspect of the invention provides a substrate processing apparatus comprising a processing chamber in which a substrate is processed, a material gas supply opening through which a material gas for forming a film containing ruthenium into the processing chamber is supplied, a cleaning gas supply opening through which a cleaning gas whose molecule has a fluorine atom or a chlorine atom into the processing chamber is supplied, and a controller that performs a control so as to clean an inside of the processing chamber by executing, alternately plural times, removing deposits containing ruthenium deposited in the processing chamber in forming the film by supplying the cleaning gas into the processing chamber and exposing surfaces of the deposits by removing a by-product generated so as to cover the surfaces of the deposits in removing the deposits.

The invention can remove deposits and by-product, shorten the cleaning downtime, and increase the productivity because the step of removing deposits containing ruthenium deposited in the processing chamber by supplying a cleaning gas whose molecule has a fluorine atom or a chlorine atom into the processing chamber and the step of exposing surfaces of the deposits by removing by-product that were generated so as to cover the surfaces of the deposits in removing the deposits are executed alternately plural times.

BRIEF DESCRIPTION OF THE DRAWINGS

FIGS. 2(a)-2(d) show details of a cleaning process according to the embodiment of the invention and, more specifically, show a state that deposits are being removed, a state that the surfaces of the deposits are being covered with by-product, a state that the by-product are being removed, and a state that the by-product have been removed completely and the deposit surfaces are exposed, respectively;

FIG. 3(a) is a graph showing how the etching rate varies with time in a deposits removing step and a by-product removing step in the embodiment of the invention;

FIG. 3(b) is a graph showing how the etching rate varies with time in a deposits removing step and a by-product removing step in a comparative example.

DESCRIPTION OF THE PREFERRED EMBODIMENT

An embodiment of the present invention will be hereinafter described. In the embodiment of the invention, a ruthenium (Ru) film, a ruthenium dioxide ($RuO_2$) film is gas-cleaned by using $ClF_3$ (chlorine trifluoride). In this gas cleaning, we consider that an Ru film or an $RuO_2$ film is removed in the form of fluorides such as $RuF_5$ (ruthenium pentafluoride) and chlorides such as $RuCl_3$ (ruthenium trichloride). Among these substances, $RuF_5$ is a solid at room temperature and its boiling point is 227° C.

During cleaning, although the temperature in the processing chamber is in a range of 100 to 350° C., the temperature may be lower than 100° C. in low-temperature portions such as a bottom portion of the processing chamber and an exhaust pipe. Therefore, in the low-temperature portions, $RuF_5$ may pile up in the form of a solid. Furthermore, Ru films or $RuO_2$ films as cleaning subject films may be covered with $RuF_5$, which obstructs the progress of the cleaning.

The inventors have studied this phenomenon diligently and found the following. In cleaning, using $ClF_3$, a processing chamber in which to form an Ru film, an $RuO_2$ film, or a lamination film thereof, by-product such as $RuF_5$ produced in the process of cleaning may cover cleaning subject films and block their cleaning by $ClF_3$, in which case the progress of the cleaning is obstructed or the cleaning is disabled in the worst case. The inventors have also found that even in such a case cleaning is enabled again by adding a step of exposing the surfaces of the cleaning subject films by removing the by-product such as $RuF_5$ that cover the cleaning subject films.

More specifically, the inventors have found that piling-up of $RUF_5$ can be suppressed by dividing a cleaning operation into plural operations and performing vacuum evacuation between the divisional cleaning operations. Although the boiling point of $RuF_5$ is 227° C., it is sufficiently probable that $RuF_5$ is vaporized even in low-temperature portions of less than 227° C. because the pressure in the processing chamber under vacuum evacuation is about 0.1 to 100 Pa.

In the embodiment of the invention, in cleaning the inside of a processing chamber using a $ClF_3$ gas in a substrate processing apparatus for forming an Ru film, an $RuO_2$ film, or a lamination film thereof, a step of removing cleaning subject films and a step of removing by-product such as $RuF_5$ are executed repeatedly. As a result, a semiconductor manufacturing method is provided which can make the downtime much shorter than in the conventional parts replacement or wet etching and is low in the number of particles generated.

Figure 1:
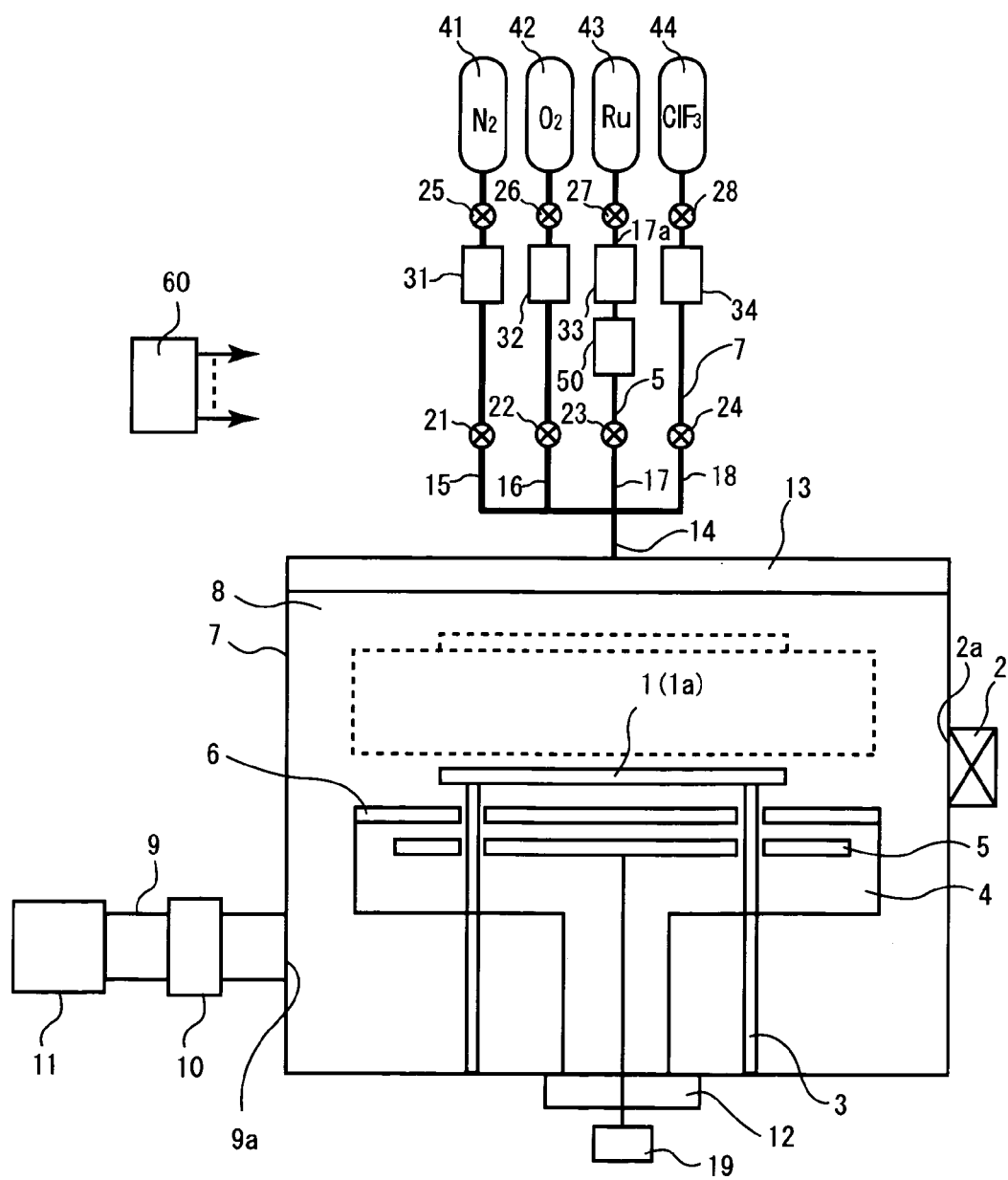
FIG. 1 is a schematic diagram of a substrate processing apparatus according to an embodiment of the present invention.

FIG. 1 is a schematic diagram showing the configuration of an example single-wafer thermal CVD apparatus which can be used as a substrate processing apparatus according to the invention. The single-wafer thermal CVD apparatus is equipped with a processing container 7 in which to form a conductive metal film on a substrate 1 such as a silicon wafer. A processing chamber 8 is formed in the processing container 7. A substrate transport opening 2a is formed through a side wall of the processing chamber 8, and a gate valve 2 that opens or closes the substrate transport opening 2a is disposed outside the processing chamber 8. By using a transport robot (not shown), a substrate 1 can be carried into or out of the processing chamber 8 through the substrate transport opening 2a that is opened by the gate valve 2.

A susceptor 6 that supports a substrate 1 is disposed inside the processing chamber 8, more specifically, on a heater unit 4 which incorporates a heater 5 that heats the substrate 1. The heater unit 4 is disposed in such a manner that it can be elevated and lowered in the processing chamber 8 by an elevator 12 and can also be rotated if necessary. While a substrate 1 is being transported, the heater unit 4 is located at a lowered position (indicated by solid lines) so that push-up pins 3 project from the surface of the susceptor 6 so as to be able to support the substrate 1. During film formation, the heater unit 4 is located at an elevated position (indicated by broken lines) so that the push-up pins 3 are merged in the heater unit 4 and the susceptor 6 supports the substrate 1. Controlled by a temperature control device (temperature control means) 19, the heater unit 4 heats the substrate 1 on the susceptor 6 to a prescribed temperature. The temperature control device 19 is controlled by a controller 60 which is a control device (control means).

A shower head 13 as a gas supply inlet is disposed at the top of the processing chamber 8. The shower head 13 is equipped with a diffusion plate that diffuses a gas supplied to it, a buffer space for dispersing the diffused gas, and a shower plate that emits the gas into the processing chamber 8 in a shower-like manner through a number of holes.

An exhaust opening 9a through which to exhaust the processing chamber 8 is formed through a side wall of the processing chamber 8 at a low position. An exhaust pipe 9 is connected to the exhaust opening 9a and is also connected to a vacuum pump 11 (exhaust apparatus) via a conductance control unit 10 which is a pressure control device (pressure control means). The pressure in the processing chamber 8 is controlled by controlling the conductance control unit 10 with the controller 60.

A gas supply pipe 14 as a pipe that supplies a gas to the shower head 13 is connected to the shower head 13. Four pipes, that is, a material gas supply pipe 17 that supplies a material gas obtained by vaporizing a ruthenium liquid material, an inert gas supply pipe 15 that supplies an inert gas, a reaction gas supply pipe 16 that supplies a reaction gas, and a cleaning gas supply pipe 18 that supplies a cleaning gas, are connected to the gas supply pipe 14. A gas flowing through each pipe can thus be supplied to the shower head 13 via the gas supply pipe 14.

The inert gas supply pipe 15, the reaction gas supply pipe 16, and the cleaning gas supply pipe 18 are connected to an insert gas supply source 41 that supplies a nitrogen ($N_2$) gas as an inert gas, a reaction gas supply source 42 that supplies an oxygen ($O_2$) gas as a reaction gas, and a cleaning gas supply source 44 that supplies a chlorine fluoride ($ClF_3$) gas as a cleaning gas via opening/closing valves 21, 22, and 24, mass flow controllers 31, 32, and 34 as flow rate control devices, and opening/closing valves 25, 26, and 28, respectively.

The material gas supply pipe 17 is connected to a vaporizer 50 that vaporizes a ruthenium liquid material via an opening/closing valve 23. A liquid material supply pipe 17a is connected to the vaporizer 50 and is also connected to a ruthenium liquid material supply source 43 that supplies a ruthenium organic liquid material (ruthenium liquid material) via a liquid mass flow controller 33 as a liquid flow rate control device and an opening/closing valve 27. An example of the ruthenium liquid material is $Ru(C_7H_7)(C_7H_{11})$ (2,4-dimethylpentadienyl ethylcyclopentadienyl ruthenium; hereinafter abbreviated as DER).

The operation of each of the devices constituting the single-wafer thermal CVD apparatus such as the opening/closing valves 21-28, the mass flow controllers 31, 32, and 34, the liquid mass flow controller 33, the vaporizer 50, the temperature control device 19, the conductance control unit 10, the vacuum pump 11, and the elevator 12 is controlled by the controller 60.

Next, a description will be made of a method for forming an Ru film or an $RuO_2$ film on a substrate in a processing chamber using the above-configured single-wafer thermal CVD apparatus as one step of a semiconductor device manufacturing process as well as a method for cleaning the inside of the processing chamber. The film forming method is such that a film is formed by CVD (chemical vapor deposition), in particular, MOCVD (metal organic chemical vapor deposition), using DER as a ruthenium organic metal liquid material which is a liquid at room temperature and using an $O_2$ gas as a reaction gas. The cleaning method is such that cleaning is performed by a thermochemical reaction using a $ClF_3$ gas as a cleaning gas. The operation of each of the devices constituting the single-wafer thermal CVD apparatus is controlled by the controller 60.

First, a description will be made of a method for forming an Ru film or an $RuO_2$ film on a substrate in the processing chamber 8.

After the gate valve 2 is opened, a silicon substrate 1 is carried into the processing chamber 8 through the substrate transport opening 2a by the transport robot (not shown) and mounted on top of the heater unit 4 which is lowered, that is, on the push-up pins 3 which project through the susceptor 6 (substrate carrying-in step). Then, the heater unit 4 is elevated to a predetermined film forming position (indicated by broken lines) by the elevator 12. During this operation, the substrate 1 is transferred from the push-up pins 3 to the susceptor 6. The substrate 1 is thus mounted on the susceptor 6 (substrate mounting step).

Then, the substrate 1 is heated for a prescribed time via the susceptor 6 by controlling the heater 5 of the heater unit 4 with the temperature control device 19, whereby the substrate temperature is kept at 250 to 350° C. (temperature stabilizing step). Furthermore, the processing chamber 8 is exhausted through the exhaust pipe 9 by controlling the conductance control unit 10 with the controller 60, whereby the pressure in the processing chamber 8 is stabilized at 0.1 to tens of Torr (13.3 to thousands of pascals) (pressure stabilizing step). At this stage, the valves 22, 23, 24, 26, 27, 28 are closed under the control of the controller 60. The valves 21 and 25 are opened, whereby the processing chamber 8 is always supplied with an $N_2$ gas with a flow rate control by the mass flow controller 31 and exhausted.

Then, the valve 27 of the liquid material supply pipe 17a is opened, whereby DER is supplied to the vaporizer 50 with a flow rate control by the liquid mass flow controller 33 and is vaporized there. For example, a resulting DER gas is exhausted through a vent line (not shown) so as not to enter the processing chamber 8.

After the temperature and the pressure in the processing chamber 8 have been stabilized, the valve 23 of the material gas supply pipe 17 is opened, whereby the DER gas is supplied to the shower head 13 from the vaporizer 50 via the material gas supply pipe 17 and the gas supply pipe 14. At the same time, the valves 22 and 26 of the reaction gas supply pipe 16 are opened, whereby an oxygen gas is supplied to the shower head 13 from the reaction gas supply source 42 via the reaction gas supply pipe 16 and the gas supply pipe 14 while its flow rate is controlled by the mass flow controller 32. The DER gas and the oxygen gas supplied to the shower head 13 are supplied into the processing chamber 8 in a shower-like manner, go down the processing chamber 8, are brought into contact with the substrate 1, and are exhausted through the exhaust pipe 9. An Ru film or an $RuO_2$ film is formed on the substrate 1 by a thermal CVD reaction (film forming step).

After the Ru film or $RuO_2$ film is formed on the substrate 1 at a prescribed thickness, the valves 22 and 23 are closed, whereby the supply of the oxygen gas and the DER gas is stopped. Then, a nitrogen gas is supplied into the processing chamber 8 from the inert gas supply source 41 via the inert gas supply pipe 15, the gas supply pipe 14, and the shower head 13 and exhausted through the exhaust pipe 9, whereby the inside of the processing chamber 8 is purged (purge step).

After the inside of the processing chamber 8 has been purged, the heater unit 4 is lowered by the elevator 12 from the film forming position (indicated by broken lines) to a transport position (indicated by solid lines). During the lowering operation, the substrate 1 is transferred from the susceptor 6 to the push-up pins 3. Then, the gate valve 2 is opened and the substrate 1 is carried out of the processing chamber 8 through the substrate transport opening 2a by the transport robot (not shown).

In the embodiment, exemplary processing conditions for forming an Ru film or an $RuO_2$ film on the substrate 1 by the thermal CVD method are as follows. The processing temperature is 250 to 350° C., the processing pressure is 0.1 to tens of Torr (13.3 to thousands of pascals), the DER supply flow rate is 0.01 to 0.2 g/min, and the oxygen gas supply flow rate is 1 to 1,000 sccm. Either of an Ru film and an $RuO_2$ film can be formed by determining film forming conditions (processing conditions) within the above ranges as appropriate for a purpose.

The above description is directed to the case of forming a film by CVD or MOCVD, ALD (atomic layer deposition) may be employed. In the latter case, the temperature and the pressure in the processing chamber 8 are set so that a DER gas that flows solely is not decomposed thermally. And a film is formed by alternately supplying a DER gas and a reaction gas plural times and supplying an inert gas for purging in between.

As film forming operations as described above are performed repeatedly, films are also deposited on portions other than the substrate 1 such as the inside surface of the processing container 7 (the inside surface of the processing chamber 8) and top portions of the heater unit 4, that is, the top surface and the side surfaces of the susceptor 6 and top portions of the side surfaces of the heater unit 4. The films peel off due to stress when the film thickness exceeds a certain value. Resulting particles may attach to the substrate 1 and lower the yield.

In view of the above, the inside of the processing chamber 8 is cleaned before films (hereinafter referred to as "deposits") deposited in the processing chamber 8 peel off. More specifically, the number of times of film formation corresponding to a time point when deposits formed in the processing chamber 8 start to peel off is measured in advance and the inside of the processing chamber 8 is cleaned before film formation is performed that number of times. That is, the inside of the processing chamber 8 is cleaned after film formation has been performed on the substrate 1 a prescribed number of times.

Films deposited in the processing chamber 8 are Ru films, $RuO_2$ films, or a mixture thereof depending on the film forming conditions such as the temperature, the pressure, and the gas flow rates. Even lamination films of an Ru film and an $RuO_2$ film may be formed.

Next, a method for cleaning the inside of the processing chamber 8 will be described with reference to FIGS. 2(a)-2(d).

After the gate valve 2 is opened, a dummy substrate 1a is transported into the processing chamber 8 through the substrate transport opening 2a by the transport robot (not shown) and mounted on top of the heater unit 4 which is lowered, that is, on the push-up pins 3 which project through the susceptor 6 (dummy substrate carrying-in step). Then, the heater unit 4 is elevated to a predetermined cleaning position (indicated by broken lines) by the elevator 12. During this operation, the dummy substrate 1a is transferred from the push-up pins 3 to the susceptor 6 (dummy substrate mounting step). Placing the dummy substrate 1a on the susceptor 6 makes it possible to protect the substrate mounting area of the susceptor 6 during cleaning and to prevent entrance of a cleaning gas into the heater unit 4.

Then, the inside of the processing chamber 8 is heated for a prescribed time by controlling the heater 5 of the heater unit 4 with the temperature control device 19, whereby the temperature in the processing chamber 8 is kept at 250 to 500° C. (temperature stabilizing step). Furthermore, the processing chamber 8 is exhausted through the exhaust pipe 9 by controlling the conductance control unit 10 with the controller 60, whereby the pressure in the processing chamber 8 is stabilized at 5 to 100 Torr (665 to 13,300 Pa) (pressure stabilizing step). At this stage, the valves 22, 23, 24, 26, 27, 28 are closed under the control of the controller 60. The valves 21 and 25 are opened, whereby the processing chamber 8 is always supplied with an $N_2$ gas with a flow rate control by the mass flow controller 31 and exhausted.

After the temperature and the pressure in the processing chamber 8 have been stabilized, the valves 24 and 28 of the cleaning gas supply pipe 18 is opened, whereby a $ClF_3$ gas is supplied to the shower head 13 from the cleaning gas supply source 44 via the cleaning gas supply pipe 18 and the gas supply pipe 14 with a flow rate control by the liquid mass flow controller 34. At this time, as described above, the $N_2$ gas is also supplied to the shower head 13.

The $ClF_3$ gas and the $N_2$ gas supplied to the shower head 13 are supplied into the processing chamber 8 in a shower-like manner, go down the processing chamber 8, are brought into contact with such portions as the susceptor 6 and the heater unit 4 in the processing chamber 8 and the inside surface of the processing container 7, and are exhausted through the exhaust pipe 9. Deposits formed in the processing chamber 8 are removed (etched away) by a thermochemical reaction (deposits removing step). That is, as shown in FIG. 2(a), the deposits formed in the processing chamber 8 are etched with the $ClF_3$ gas. As shown in FIG. 2(b), in the process of the cleaning, by-product that are fluorides such as $RuF_5$ and chlorides such as $RuCl_3$ are formed on the deposits so as to cover their surfaces.

After deposits have been removed for a prescribed time, the valves 24 and 28 are closed, whereby the supply of the $ClF_3$ gas is stopped. And the processing chamber 8 is vacuum-evacuated. At this time, a pressure control is performed so that the exhaust rate is made highest. More specifically, the pressure in the processing chamber 8 is controlled to 0.1 to 100 Pa by controlling the conductance control unit 10 with the controller 60. As a result, the by-product that were generated so as to cover the surfaces of the deposits in removing the deposits, that is, the fluorides such as $RuF_5$ and the chlorides such as $RuCl_3$, can be vaporized and removed as shown in FIG. 2(c) and the surfaces of the deposits can be exposed as shown in FIG. 2(d) (by-product removing step (deposit surfaces exposing step)). The processing chamber 8 may be vacuum-evacuated in a state that the valves 21 and 25 are kept open and the inert gas is supplied into the processing chamber 8, or in a state that the valves 21 and 25 are closed and the supply of the insert gas into the processing chamber 8 is stopped.

The cycle consisting of the deposits removing step and the by-product removing step (deposit surfaces exposing step) is repeated until the deposits formed in the processing chamber 8 are removed sufficiently.

After the inside of the processing chamber 8 has been cleaned up, the heater unit 4 is lowered by the elevator 12 from the cleaning position (indicated by broken lines) to the transport position (indicated by solid lines). During the lowering operation, the dummy substrate 1a is transferred from the susceptor 6 to the push-up pins 3. Then, the gate valve 2 is opened and the dummy substrate 1a is carried out of the processing chamber 8 through the substrate transport opening 2a by the transport robot (not shown).

It is preferable that the step of removing by-product such as $RuF_5$ (vacuum evacuation step) be started at or a little before a time point when the reaction of etching of Ru films or $RuO_2$ films with $ClF_3$ has stopped or stops. For example, whether the etching reaction has stopped is judged by judging whether a time T1 has elapsed from a start of flowing of a $ClF_3$ gas. The time T1 is a time that is taken from a start of flowing of a $ClF_3$ gas to a stop of an etching reaction and is measured in advance. The "time point when the etching reaction has stopped" means a time point when the time T1 has just elapsed and "a little before the time point when the etching reaction stops" means a little before the time T1 elapses.

It is preferable that as shown in FIG. 3(a) each step of removing by-product such as $RuF_5$ (vacuum evacuation step) be finished after by-product such as $RuF_5$ that cover the surfaces of Ru films or $RuO_2$ films have been removed completely and the surfaces of the Ru films or $RuO_2$ films are exposed completely. In this case, the etching rate at the restart of each deposits removing step in which a $ClF_3$ gas is caused to flow is recovered to a level obtained when the deposit surfaces were not covered with the by-product, whereby the total cleaning efficiency is increased. In contrast, if as shown in FIG. 3(b) each by-product removing step (vacuum evacuation step) is finished and a deposits removing step in which a $ClF_3$ gas is caused to flow is restarted before by-product is removed completely, a state is maintained that the cleaning of Ru films or $RuO_2$ films with $ClF_3$ is blocked by the by-product, that is, the progress of the cleaning is obstructed. Therefore, the etching rate is not sufficiently recovered at the restart of the cleaning and the total cleaning time becomes longer. That is, although the time of each by-product removing step can be shortened, the total cleaning efficiency is lowered. For example, whether by-product such as $RuF_5$ have been removed completely is judged by judging whether a time T2 has elapsed from a start of vacuum evacuation. The time T2 is a time that is taken from a start of vacuum evacuation to complete removal of by-product such as $RuF_5$ and is measured in advance. The "time point when by-product such as $RuF_5$ have been removed completely" means a time point when the time T2 has just elapsed.

In the embodiment, exemplary conditions for cleaning the inside of the processing chamber 8 are as follows. The temperature is 250 to 500° C., the pressure at the time of removal of deposits is 5 to 100 Torr (665 to 13,300 Pa), the pressure at the time of removal of by-product is 0.1 to 100 Pa, the $ClF_3$ gas supply flow rate is 100 to 2,000 sccm, the $N_2$ gas supply flow rate is 100 to 2,000 sccm, the total cleaning time is 30 to 120 minutes, the by-product removal time is 1 to 30 minutes, and the number of cycles is 2 to 10. Cleaning is performed by keeping the individual conditions constant at certain values within the above ranges. Whereas the cleaning temperature may be set higher than the film forming temperature, it is preferable to set the cleaning temperature equal to the film forming temperature. This dispenses with steps of changing the temperature in the processing chamber 8 (a temperature increasing step and a temperature decreasing step) to be executed in a transition from a film forming step to a cleaning step and a transition from a cleaning step to a film forming step, whereby the apparatus downtime is shortened further.

Figure 4:
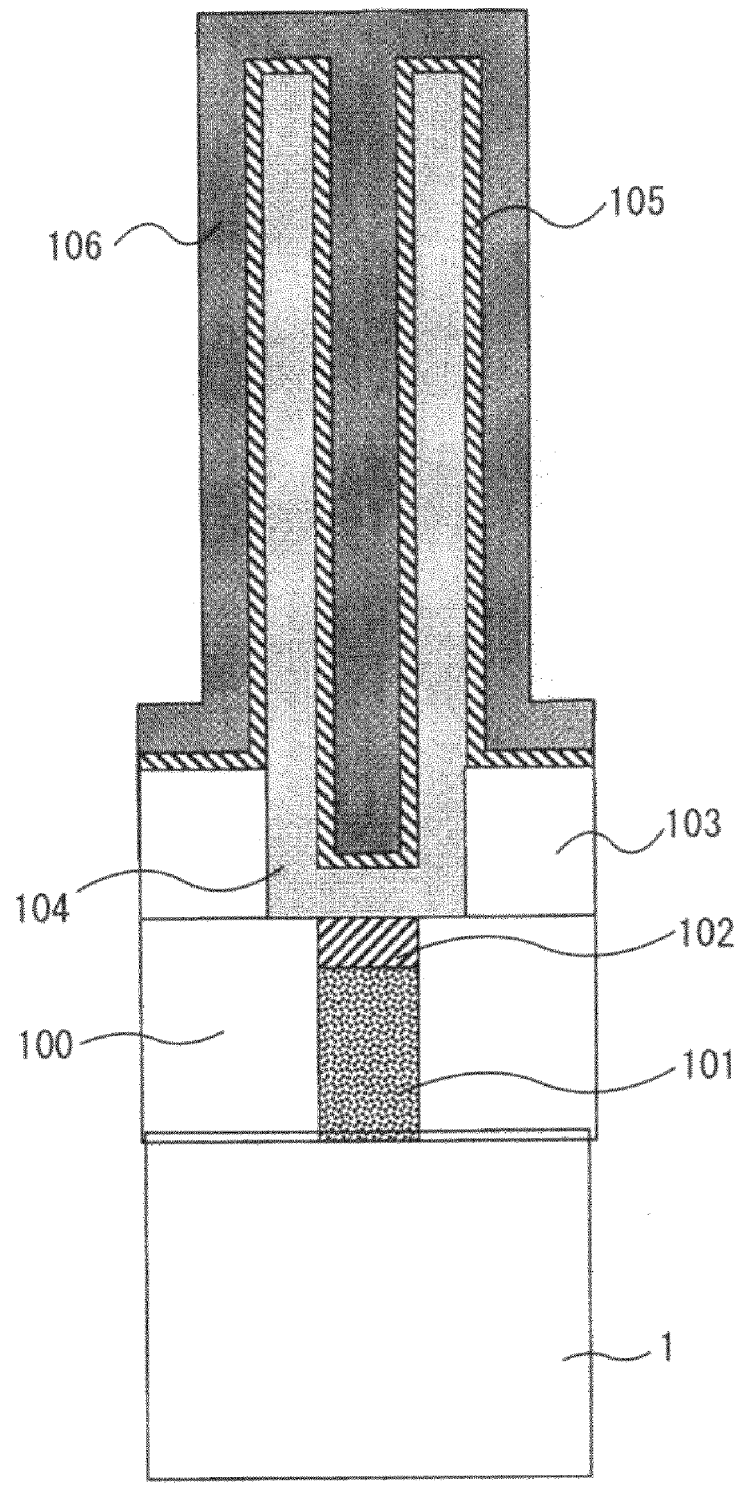
FIG. 4 is a sectional view showing part of a DRAM capacitor including a bottom electrode film and a top electrode film manufactured according to the invention.

Next, a description will be made of an example in which the invention is applied to manufacture of a DRAM capacitor, that is, an example in which the substrate processing apparatus of the invention as cleaned is used for forming a bottom electrode film and a top electrode film of a DRAM capacitor. FIG. 4 is a sectional view of part of a DRAM capacitor including a bottom electrode film and a top electrode film.

First, an interlayer insulating film 100 made of an insulator such as $SiO_2$ is formed on a silicon substrate 1. Then, a contact hole 107 is formed so as to penetrate through the interlayer insulating film 100.

Then, a contact plug 101 for connection to the silicon substrate 1 is formed inside the contact hole 107. An example material of the contact plug 101 is tungsten (W).

Then, a barrier metal film 102 is formed so as to fill in the space over the contact plug 101. Example materials of the barrier metal film 102 are TiN and TaN. The barrier metal film 102 serves to prevent an electrode material or an oxidizing agent from being diffused into the contact plug 101.

Then, an interlayer insulating film 103 is formed on the entire surfaces of the interlayer insulating film 100 and the barrier metal film 102. A contact hole 108 is formed so as to penetrate through the interlayer insulating film 103.

Subsequently, a bottom electrode film 104 which is an Ru film, an $RuO_2$ film, or a lamination film thereof is formed in the contact hole 108 and on the entire surface of the interlayer insulating film 103 by using the substrate processing apparatus of the invention as cleaned.

Then, the part of the bottom electrode film 104 that is formed on the interlayer insulating film 103 is removed whereas the part of the bottom electrode film 104 that is formed in the contact hole 108 is left. Then, an inside portion of the bottom electrode film 104 remaining in the contact hole 108 is etched away, whereby the bottom electrode film 104 is shaped into a cylinder shape.

Then, a capacitance insulating film 105 is formed on the entire surfaces of the bottom electrode film 104 and the interlayer insulating film 103. Example materials of the capacitance insulating film 105 are $Ta_2O_5$, $Al_2O_3$, and $ZrO_2$.

Finally, a top electrode film 106 which is an Ru film, an $RuO_2$ film, or a lamination film thereof is formed on the entire surface of the capacitance insulating film 105 by using the substrate processing apparatus of the invention as cleaned. The manufacture of the DRAM capacitor shown in FIG. 4 is thus completed.

In the invention, a step of removing deposits containing ruthenium and a step of exposing the surfaces of the deposits by removing by-product that was generated so as to cover the surfaces of the deposits in removing the deposits are executed alternately plural times. The invention can thus provide a substrate processing apparatus which is high in mass-productivity and can form a superior film with a small number of particles and increase the yield of semiconductor device manufacture.

One aspect of the invention provides a manufacturing method of a semiconductor device, comprising the steps of carrying a substrate into a processing chamber; forming a film containing ruthenium on the substrate by supplying a material gas into the processing chamber; carrying the film-formed substrate out of the processing chamber; and cleaning the inside of the processing chamber by executing, alternately plural times, a substep of removing deposits containing ruthenium deposited in the processing chamber by supplying a cleaning gas whose molecule has a fluorine atom or a chlorine atom into the processing chamber and a substep of exposing surfaces of the deposits by removing by-product that was generated so as to cover the surfaces of the deposits in removing the deposits.

It is preferable that the by-product be a fluoride or a chloride.

It is preferable that the by-product be $RuF_5$ or $RuCl_3$.

It is preferable that the by-product removing substep be started after or a little before the surfaces of the deposits have been or are completely covered with the by-product.

It is preferable that the by-product removing substep be started at or a little before a time point when a reaction of etching the deposits with the cleaning gas has stopped or stops.

It is preferable that the by-product removing substep be started at or a little before a time point when a reaction of etching the deposits with the cleaning gas has been or is completely blocked by the by-product.

It is preferable that the by-product removing substep be executed until the by-product is completely removed and the surfaces of the deposits are exposed completely.

It is preferable that the by-product removing substep be executed until a rate of etching of the deposits with the cleaning gas is recovered to a level that was obtained before generation of the by-product.

It is preferable that the by-product removing substep be executed by vacuum-evacuating the processing chamber in a state that the cleaning gas is not supplied into it.

It is preferable that the by-product removing substep be executed by vacuum-evacuating the processing chamber in a state that the cleaning gas is not supplied into it and an inert gas is supplied into it.

Furthermore, it is preferable that the processing chamber cleaning step be executed under conditions that temperature in the processing chamber is 250 to 500° C., pressure in the processing chamber when the deposits are removed is 665 to 13,300 Pa, and pressure in the processing chamber when the by-product is removed is 0.1 to 100 Pa.

It is preferable that the cleaning gas be a $ClF_3$ gas.

It is preferable that the film containing ruthenium be a ruthenium film, a ruthenium oxide film, or a lamination film of a ruthenium film and a ruthenium oxide film.

Another aspect of the invention provides a substrate processing apparatus comprising a processing chamber in which to process a substrate; a material gas supply opening through which to supply a material gas for forming a film containing ruthenium into the processing chamber; a cleaning gas supply opening through which to supply a cleaning gas whose molecule has a fluorine atom or a chlorine atom into the processing chamber; and a controller that performs a control so as to clean the inside of the processing chamber by executing, alternately plural times, a step of removing deposits containing ruthenium that were deposited in the processing chamber in forming the film by supplying the cleaning gas into the processing chamber and a step of exposing surfaces of the deposits by removing by-product generated so as to cover the surfaces of the deposits in removing the deposits.

What is claimed is:

1. A method of manufacturing a semiconductor device, comprising:

carrying a substrate into a processing chamber;

supplying a material gas into the processing chamber to form a film containing ruthenium on the substrate, wherein ruthenium-containing deposits are formed on an inside of the processing chamber;

carrying the film-formed substrate out of the processing chamber; and cleaning the inside of the processing chamber, the step of cleaning comprising:

supplying a cleaning gas whose molecule has a fluorine atom or a chlorine atom into the processing chamber for removing some of the ruthenium-containing deposits, wherein a by-product is generated so as to cover a surface of the remaining ruthenium-containing deposits;

vacuum-evacuating the inside of the processing chamber for removing the by-product and uncovering the surface of the remaining ruthenium-containing deposits, wherein the steps of supplying and vacuum-evacuating alternate plural times, and the cleaning gas is not supplied during the step of vacuum-evacuating.

2. The method of manufacturing a semiconductor device according to claim 1, wherein the by-product is fluoride or chloride.

3. The method of manufacturing a semiconductor device according to claim 1, wherein the by-product is RuF5 or RuCl3.

4. The method of manufacturing a semiconductor device according to claim 1, wherein an inert gas is supplied into the processing chamber during the step of vacuum-evacuating.

5. The method of manufacturing a semiconductor device according to claim 1, wherein the processing chamber cleaning is executed under conditions that temperature in the processing chamber is 250 to 500° C., pressure in the processing chamber when the ruthenium-containing deposits are removed is 665 to 13,300 Pa, and pressure in the processing chamber when the by-product is removed is 0.1 to 100 Pa.

6. The method of manufacturing a semiconductor device according to claim 1, wherein the cleaning gas is a ClF3 gas.

7. The method of manufacturing a semiconductor device according to claim 1, wherein the film containing ruthenium is a ruthenium film, a ruthenium oxide film, or a lamination film of a ruthenium film and a ruthenium oxide film.

8. A substrate processing apparatus comprising:
   a processing chamber in which a substrate is processed;
   a material gas supply system through which a material gas is supplied into the processing chamber for forming a film containing ruthenium onto the substrate, wherein ruthenium-containing deposits are formed on an inside of the processing chamber;
   a vacuum-evacuator for vacuum-evacuating the inside of the processing chamber;
   a cleaning gas supply system through which a cleaning gas whose molecule has a fluorine atom or a chlorine atom is supplied into the processing chamber; and
   a controller that performs a control so as to clean the inside of the processing chamber, the control comprises:
      controlling the cleaning gas supply system to supply the cleaning gas into the processing chamber for removing some of the ruthenium-containing deposits, wherein a by-product is generated so as to cover a surface of the remaining ruthenium-containing deposits;
      controlling the vacuum-evacuator to vacuum-evacuate the inside of the processing chamber for removing the by-product and uncovering the surface of the remaining ruthenium-containing deposits,
      wherein the controlling the cleaning gas supply system to supply the cleaning gas and the controlling the vacuum-evacuator to vacuum-evacuate the inside of the processing chamber are alternated plural times, and
      the controller controls the cleaning gas supply system to not supply the cleaning gas during the vacuum-evacuating of the inside of the processing chamber.

* * * * *